United States Patent

Senoo et al.

[11] Patent Number: 6,042,922
[45] Date of Patent: Mar. 28, 2000

[54] ADHESIVE SHEET FOR WAFER SETTING AND PROCESS FOR PRODUCING ELECTRONIC COMPONENT

[75] Inventors: Hideo Senoo, Wako; Takashi Sugino, Kawaguchi; Shunsaku Node, Toda, all of Japan

[73] Assignee: Lintec Corporation, Japan

[21] Appl. No.: 09/028,147

[22] Filed: Feb. 23, 1998

[30] Foreign Application Priority Data

Feb. 24, 1997 [JP] Japan .................................. 9-039196

[51] Int. Cl.[7] ...................................................... B32B 3/02
[52] U.S. Cl. ...................... 428/66.6; 428/157; 428/212; 428/213; 428/354; 156/344; 156/584; 438/464; 438/976
[58] Field of Search ...................... 156/344, 584; 438/33, 68, 113, 114, 464, 465, 976, FOR 386; 29/426.1, 426.3, 426.5, 426.6, 762; 428/66.6, 157, 212, 213, 354

[56] References Cited

U.S. PATENT DOCUMENTS 5,705,016  1/1998  Senoo et al. .................... 156/344 X

OTHER PUBLICATIONS

Japanese Publication No. 02265258, Abstract, Oct. 30, 1990, 1 p., English language.
Japanese Publication No. 05299504, Abstract, Nov. 12, 1993, 1 p., English language.

*Primary Examiner*—Mark A. Osele
*Attorney, Agent, or Firm*—Webb Ziesenheim Logsdon Orkin & Hanson, P.C.

[57] ABSTRACT

An adhesive sheet for wafer setting, comprising a wafer setting part composed of an expansible film and an adhesive layer for wafer setting and a marginal part outside the wafer setting part, wherein the marginal part has an antiexpansibility greater than that of the wafer setting part. This enables secure expansion in a process for producing an electronic component.

4 Claims, 2 Drawing Sheets ically employed adhesive sheets 1 comprising
ADHESIVE SHEET FOR WAFER SETTING AND PROCESS FOR PRODUCING ELECTRONIC COMPONENT

FIELD OF THE INVENTION

The present invention relates to an adhesive sheet for wafer setting and a process for producing an electronic component. More particularly, the present invention is concerned with an adhesive sheet for wafer setting and a process for producing an electronic component, by which an expanding step can securely be performed in the production of small electronic components such as semiconductor chips.

BACKGROUND OF THE INVENTION

A semiconductor wafer of, for example, silicon or gallium arsenide is produced in a large diameter, cut and separated (diced) into elemental chips and subjected to the subsequent mounting step. In this process, the semiconductor wafer undergoes dicing and expansion steps in the state of being attached to an adhesive sheet and is transferred to the subsequent pickup and mounting steps.

In the expansion step, the adhesive sheet is extended so that chip spacings are expanded. The objective of the expansion step in which chip spacings are expanded is, for example, to facilitate chip recognition in the die bonding and to prevent device breakage attributed to mutual abuttal of neighboring chips in the pickup step.

Currently, the expansion step is carried out by extending the adhesive sheet with the use of an expanding apparatus.

In most expanding apparatuses, the degree of extension and the torque during the extension are fixed to thereby render difficult adjusting dependent upon the type of adhesive sheet and the size of device.

Accordingly, it has occurred that, when the adhesive sheet is soft, the extending stress is not conveyed to the wafer setting portion to thereby prevent the attainment of satisfactory chip spacings. On the other hand, when the adhesive sheet is hard, the torque of the apparatus is unsatisfactory or the adhesive sheet is torn.

OBJECT OF INVENTION

The present invention has been made with a view toward resolving the above problems of the prior art.

An object of the present invention is to enable secure performance of the expansion step in the production of electronic components.

SUMMARY OF THE INVENTION

The adhesive sheet for wafer setting according to the present invention comprises a wafer setting part composed of an expansible film and an adhesive layer for wafer setting and a marginal part outside the wafer setting parts, wherein the marginal part has an antiexpansibility greater than that of the wafer setting part.

The above antiexpansibility is expressed by the formula:

antiexpansibility=sum of (elastic modulus of each layer)×(thickness of the layer).

In the present invention, it is preferred that the antiexpansibility of the marginal part be at least 1.3 times that of the wafer setting part.

For example, the above adhesive sheet for wafer setting comprises an adhesive sheet comprising an expansible film and an adhesive layer for wafer setting, this adhesive sheet having a marginal part to which an antiexpansibility increasing film is laminated.

The process for producing an electronic component according to the present invention comprises a step of expanding an adhesive sheet, wherein the above adhesive sheet for wafer setting according to the present invention is used as the adhesive sheet.

DETAILED DESCRIPTION OF THE INVENTION

Figure 1:
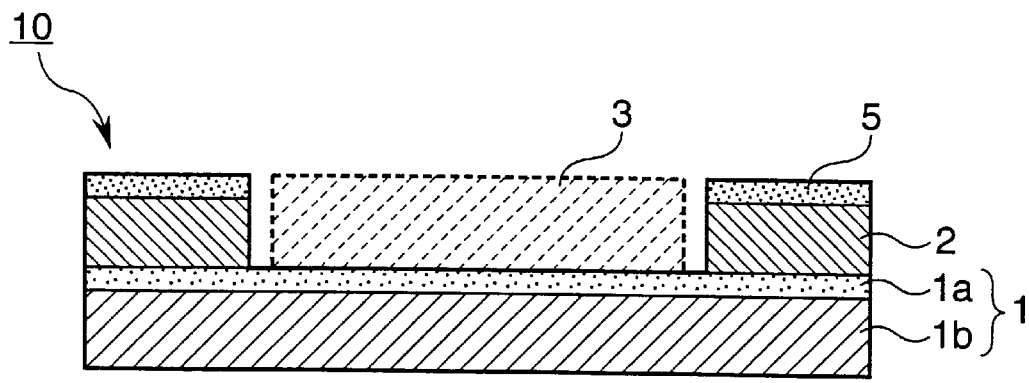
FIGS. 1 to 5 show varieties of adhesive sheet for wafer setting according to the present invention.

The present invention will be described in detail below, referring to the appended drawings.

In particular, referring to FIGS. 1 to 5, the adhesive sheet for wafer setting 10 according to the present invention has a fundamental structure consisting of any of various conventionally employed adhesive sheets 1 comprising a wafer setting part composed of an expansible film 1b and an adhesive layer for wafer setting 1a. The adhesive sheet for wafer setting 10 according to the present invention is characterized in that the antiexpansibility of a marginal part of the adhesive sheet 1 is greater than that of the wafer setting parts.

In the above adhesive sheet for wafer setting 10, the terminology "marginal part" refers to the part of the sheet which lie at least inside of ring frame fixed part and which exclude the part on which wafers 3 (indicated by broken lines in the drawings) are set.

The terminology "antiexpansibility" means the magnitude of stress transmittability from one site to neighboring site. In the present invention, the antiexpansibility is evaluated by the value defined by the formula:

antiexpansibility=sum of (elastic modulus of each layer)×(thickness of the layer).

For example, in the adhesive sheet for wafer setting 10 structured as shown in FIG. 1, the antiexpansibility of the wafer setting part is given by (elastic modulus of adhesive layer for wafer setting 1a)×(thickness of adhesive layer for wafer setting 1a)+(elastic modulus of expansible film 1b)×(thickness of expansible film 1b).

On the other hand, the antiexpansibility of the marginal part is given by (elastic modulus of adhesive layer for wafer setting 1a)×(thickness of adhesive layer for wafer setting 1a)+(elastic modulus of expansible film 1b)×(thickness of expansible film 1b)+(elastic modulus of antiexpansibility increasing film 2)×(thickness of antiexpansibility increasing film 2)+(elastic modulus of adhesive layer 5)×(thickness of adhesive layer 5).

In the present invention, the antiexpansibility of the above marginal part is greater than that of the wafer setting part. It is preferred that the antiexpansibility of the marginal part be at least 1.3 times, especially, at least 1.5 time that of the wafer setting part.

The above adhesive sheet for wafer setting 10, for example, comprises a generally employed adhesive sheet 1 comprising an expansible film 1b and an adhesive layer for wafer setting 1a, this adhesive sheet 1 having a marginal part to which an antiexpansibility increasing film 2 is laminated.

Figure 2:
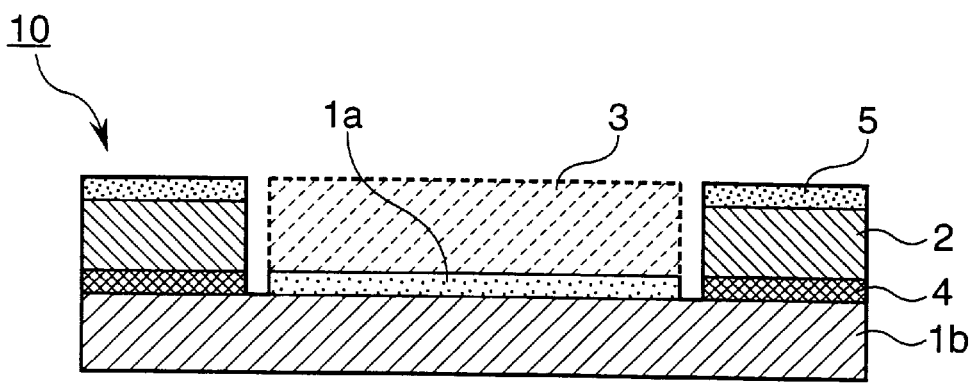

The antiexpansibility increasing film 2 may be disposed on the marginal part of the adhesive layer 1a of the adhesive sheet 1, as shown in FIG. 1. Referring to FIG. 2, when the adhesive layer 1a is formed only on and around the wafer setting part of a surface of the expansible film 1b, the antiexpansibility increasing film 2 may be laminated either directly or through the medium of an adhesive layer 4 onto the marginal part of the surface of the expansible film 1b. Further, referring to FIG. 3, the antiexpansibility increasing film 2 may be laminated either directly or through the medium of an adhesive layer 4 onto another surface (back of the expansible film 1b) of the expansible film 1b opposite to the adhesive layer. Also, the antiexpansibility increasing film 2 may be disposed on both the marginal parts of the surface of the adhesive layer 1a or expansible film 1b and the marginal part of the back of the expansible film 1b. Still further, referring to FIGS. 4 and 5, the adhesive sheet for wafer setting 10 according to the present invention may have such a structure that a marginal part forming film whose antiexpansibility is greater than that of the adhesive sheet continues from an edge of the adhesive sheet whose surface area is slightly greater than that of the wafer setting parts.

Although the expansible film 1b is not particularly limited, it is preferred that the expansible film have high water and heat resistances and be composed of a synthetic resin.

Examples of suitable expansible films 1b include films of low density polyethylene (LDPE), linear low density polyethylene (LLDPE), ethylene/propylene copolymer, polypropylene, polybutene, polybutadiene, polymethylpentene, ethylene/vinyl acetate copolymer, ethylene/(meth)acrylic acid copolymer, ethylene/methyl (meth)acrylate copolymer, ethylene/ethyl (meth)acrylate copolymer, polyvinyl chloride, vinyl chloride/vinyl acetate copolymer, ethylene/vinyl chloride/vinyl acetate copolymer, polyurethanes, polyamides, ionomers, styrene/butadiene rubber and products of hydrogenation or other modification of styrene/butadiene rubber. These expansible films 1b can be used in combination. Moreover, use can be made of a film of a polymer of a compound having a carboxyl group as a polymer structural unit and a laminate of this film and a generally employed polymer film.

The thickness of the above expansible film 1b generally ranges from 5 to 500 $\mu$m, preferably, from 10 to 300 $\mu$m. It is preferred that the elastic modulus of the expansible film 1b be less than $1\times10^9$ N/m$^2$, especially, from $1\times10^7$ to $1\times10^9$ N/m$^2$. Thus, it is preferred that the antiexpansibility of the expansible film 1b be less than $5\times10^5$ N/m, especially, from $1\times10^2$ to $3\times10^5$ N/m.

The side of the expansible film 1b brought into contact with another layer may be provided with corona treatment or may have a primer or other layer attached thereto for improving the adherence.

In the present invention, the adhesive layer for wafer setting may be irradiated with ultraviolet rays prior to or after the dicing step. When the irradiation is effected, the expansible film 1b must be transparent.

The adhesive layer for wafer setting 1a can be produced from various conventional adhesives. These adhesives are not particularly limited and some examples thereof include adhesives based on a rubber, an acrylic, a silicone and a polyvinyl ether. Also, use can be made of adhesives which are curable by radiation and adhesives which foam when heated. Further, use can be made of adhesives usable in both dicing and die bonding.

Although depending on the properties of the materials thereof, the thickness of the adhesive layer 1a generally ranges from about 3 to 100 $\mu$m, preferably, from about 10 to 50 $\mu$m. It is preferred that the elastic modulus of the adhesive layer 1a range from $1\times10^3$ to $1\times10^9$ N/m$^2$, especially, from $1\times10^4$ to $1\times10^8$ N/m$^2$. Thus, it is preferred that the antiexpansibility of the adhesive layer 1a range from $3\times10^{-3}$ to $1\times10^5$ N/m, especially, from $1\times10^{-1}$ to $5\times10^3$ N/m.

The adhesive layer for wafer setting 1a may be cured by heating or irradiation with ultraviolet rays prior to the expanding step to thereby have a change of elastic modulus. The elastic modulus at the expanding step contributes to the antiexpansibility thereof.

Polyethylene terephthalate and polybutylene terephthalate in addition to polymers set forth above as materials of the expansible film can be mentioned as materials of the antiexpansibility increasing film 2.

Although depending on the properties of the materials thereof, the thickness of the antiexpansibility increasing film 2 generally ranges from about 5 to 500 $\mu$m, preferably, from about 10 to 300 $\mu$m. It is preferred that the elastic modulus of the antiexpansibility increasing film 2 range from $1\times10^7$ to $1\times10^{10}$ N/m$^2$, especially, from $5\times10^7$ to $5\times10^9$ N/m$^2$. Thus, it is preferred that the antiexpansibility of the antiexpansibility increasing film 2 range from $5\times10^1$ to $5\times10^6$ N/m, especially, from $5\times10^2$ to $1.5\times10^6$ N/m.

Figure 4:
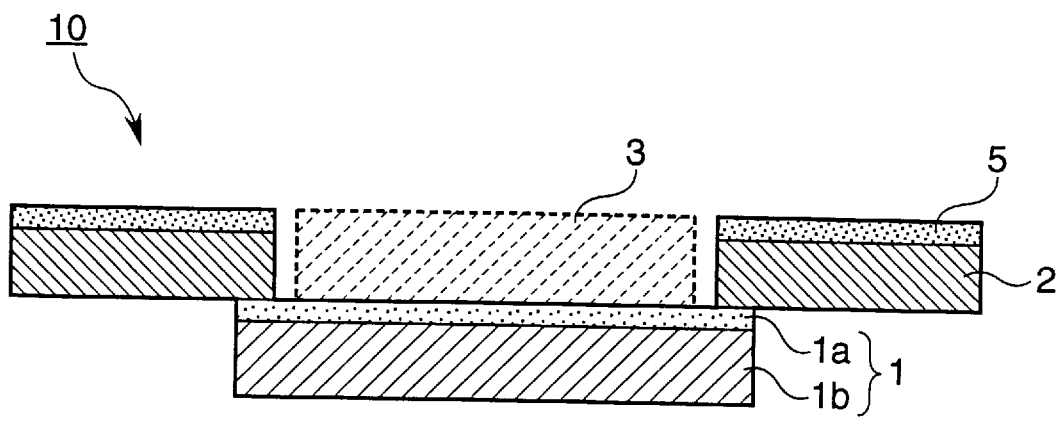

In the structure of FIG. 1 or FIG. 4, the antiexpansibility increasing film 2 is laminated onto the adhesive layer 1a of the adhesive sheet 1.

Figure 3:
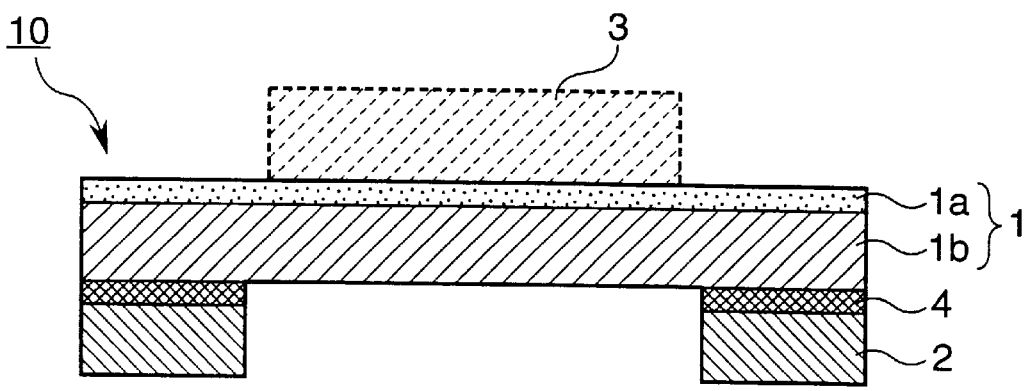
Figure 5:
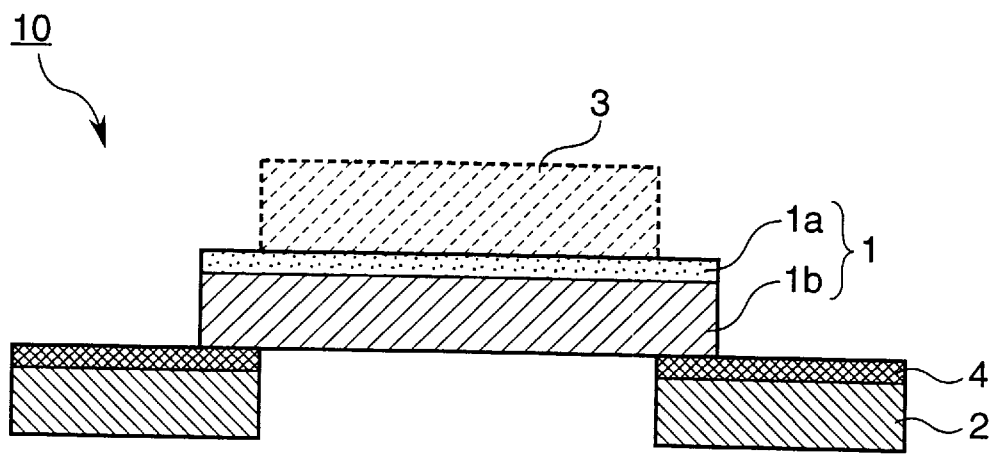

In the structure of FIG. 2, FIG. 3 or FIG. 5, the antiexpansibility increasing film is laminated directly or through the medium of an adhesive layer 4 onto the expansible film 1b.

The adhesive employed for bonding the antiexpansibility increasing film 2 with the expansible film 1b is not particularly limited and generally used adhesives may be employed. Examples of suitable adhesives include adhesives such as those based on an acrylic, a rubber and a silicone and thermoplastic or thermosetting adhesives such as those based on a polyester, a polyamide, an ethylene copolymer, an epoxy and a urethane.

Although depending on the properties of the materials thereof, the thickness of the adhesive layer 4 generally ranges from about 3 to 50 $\mu$m, preferably, from about 5 to 30 $\mu$m. It is preferred that the elastic modulus of the adhesive layer 4 range from $1\times10^3$ to $1\times10^9$ N/m$^2$, especially, from $1\times10^4$ to $1\times10^8$ N/m$^2$. Thus, it is preferred that the antiexpansibility of the adhesive layer 4 range from $3\times10^{-3}$ to $5\times10^4$ N/m, especially, from $5\times10^{-2}$ to $3\times10^3$ N/m.

Also, without the use of the adhesive layer 4, the antiexpansibility increasing film 2 and the expansible film 1b can be laminated onto each other by, for example, heat sealing.

In the structure of FIG. 1 or FIG. 2, it is preferred that an adhesive layer 5 be disposed on the antiexpansibility increasing film 2. The adhesive layer 5 is used for fixing a ring frame. The ring frame is a jig for conveyance and processing which supports the wafer during the dicing step and the bonding step, etc.

Although depending on the properties of the materials thereof, the thickness of the adhesive layer 5 generally ranges from about 3 to 50 $\mu$m, preferably, from about 5 to 30 $\mu$m. It is preferred that the elastic modulus of the adhesive layer 5 range from $1\times10^3$ to $1\times10^9$ N/m$^2$, especially, from $1\times10^4$ to $1\times10^8$ N/m$^2$. Thus, it is preferred that the antiexpansibility of the adhesive layer 5 range from $3\times10^{-3}$ to $5\times10^4$ N/m, especially, from $5\times10^{-2}$ to $3\times10^3$ N/m.

It is not necessarily required that the antiexpansibility increasing film 2 be formed in a circularly continued shape. The antiexpansibility increasing film 2 may be formed discontinuously on the marginal part of the adhesive sheet for wafer setting 10.

The process for producing an electronic component according to the present invention will now be described.

The process for producing an electronic component according to the present invention comprises a step of expanding an adhesive sheet, wherein the above adhesive sheet for wafer setting according to the present invention is used as the adhesive sheet.

More particularly, in the common process for producing an electronic component, namely, in the process including the steps of sticking a wafer to an adhesive sheet, dicing the wafer into chips, expanding the adhesive sheet having the chips stuck thereto to thereby extend chip spacings, picking the chips up and assembling the chips into electronic components, the improvement comprises reinforcing a marginal part of the adhesive sheet for wafer setting with an antiexpansibility increasing film prior to the expanding step. Those described above are used as the adhesive sheet and the antiexpansibility increasing film.

In the process of the present invention, the above adhesive sheet for wafer setting 10 having the antiexpansibility increasing film 2 or the common adhesive sheet 1 whose marginal part is not reinforced can be used as the adhesive sheet for wafer setting 10.

When the adhesive sheet for wafer setting 10 having the antiexpansibility increasing film 2 is employed, it is naturally unnecessary to stick a new antiexpansibility increasing film 2 thereto. The reason is that, prior to the expanding step, the marginal part of the adhesive sheet for wafer setting is reinforced by the antiexpansibility increasing film.

On the other hand, when the common adhesive sheet 1 whose the marginal part is not reinforced is employed, an antiexpansibility increasing film is stuck to appropriate positions at any of the steps prior to the expanding step. That is, the antiexpansibility increasing film is stuck to the marginal part of the adhesive sheet at any of stages preceding or ensuing the sticking of the wafer to the adhesive sheet, preceding or ensuing the dicing of the wafer into chips and preceding the expansion of the adhesive sheet.

EFFECT OF INVENTION

As apparent from the foregoing, the present invention causes the antiexpansibility of the marginal part of the adhesive sheet for wafer setting 10 to be greater than that of the wafer setting part of the adhesive sheet for wafer setting 10, thereby preventing extension of only the marginal part of the sheet at the time of the expansion. As a result, the stress is transmitted without being damped to the part having the wafer stuck thereto (namely, a part having a multiplicity of chips fixed thereto), so that the chip spacings are satisfactorily extended to thereby enable minimizing malfunctions at the time of picking up of the chips.

EXAMPLE

The present invention will be illustrated in detail below with reference to the following Examples which in no way limit the scope of the invention.

In the following Examples and Comparative Example, the chip spacing was evaluated in the following manner.
Chip Spacing A 6 inch silicon wafer was set on the adhesive layer of the adhesive sheet for wafer setting produced in each of the following Examples and Comparative Examples, and the adhesive sheet for wafer setting was fixed by means of a ring frame. The wafer was diced by the customary procedure into 10 mm×10 mm IC chips. Thereafter, a 15 mm expansion was carried out by the use of expander HS-1010 manufactured by HUGRE ELECTRONICS, and the chip spacings were measured by the use of an optical microscope. In Examples 1, 2, 3 and 5 and Comparative Examples 1, 2 and 3, ultraviolet irradiation (quantity of light: 220 mJ/cm$^2$) was performed after the dicing and, thereafter, the chip spacings were measured.

EXAMPLE 1

Use was made of a dicing/die bonding sheet, as an adhesive sheet, composed of an expansible film of an ethylene/methyl methacrylate copolymer (elastic modulus: $1.00 \times 10^8$ N/m$^2$, thickness: 80 μm and antiexpansibility: $8.0 \times 10^3$ N/m) and a thermosetting adhesive layer based on acrylic polymer containing epoxy resin (elastic modulus: $3.0 \times 10^6$ N/m$^2$, thickness: 20 μm and antiexpansibility: $6.0 \times 10^1$ N/m). Prior to use, a release film (polyethylene terephthalate film, thickness: 38 μm) was stuck to the adhesive layer in order to protect the adhesive layer.

A soft polyvinyl chloride film (elastic modulus: $1.80 \times 10^8$ N/M$^2$, thickness: 70 μm and antiexpansibility: $1.26 \times 10^4$ N/m) was used as an antiexpansibility increasing film, and a repeeling type adhesive (acrylic polymer crosslinking type, elastic modulus: $3.0 \times 10^5$ N/m$^2$, thickness: 10 μm and antiexpansibility: 3.0 N/m) was used as a ring frame fixing adhesive. The employed antiexpansibility increasing film had an inside diameter of 165 mm and an outside diameter of 207 mm, which was the same as the diameter of the expansible film.

The chip spacings of the thus obtained adhesive sheet for wafer setting were measured. The results are given in Table 1.

EXAMPLE 2

The same procedure as in Example 1 was repeated except that the expansible film of Example 1 was replaced by a laminate film (30 μm/35 μm/30 μm, elastic modulus: $9.0 \times 10^7$ N/m$^2$ and antiexpansibility: $8.6 \times 10^3$ N/M) of an ethylene/methyl methacrylate copolymer, an elastomer (modified styrene/butadiene rubber) and an ethylene/methacrylic acid copolymer. The results are given in Table 1.

EXAMPLE 3

The same procedure as in Example 1 was repeated except that the expansible film of Example 1 was replaced by a laminate film (30 μm/40 μm/30 μm, elastic modulus: $5.6 \times 10^7$ N/m$^2$ and antiexpansibility: $5.6 \times 10^3$ N/m) of an ethylene/methyl methacrylate copolymer, an elastomer (product of hydrogenation of styrene/butadiene rubber) and an ethylene/methacrylic acid copolymer. The results are given in Table 1.

EXAMPLE 4

Use was made of a dicing sheet, as an adhesive sheet, composed of an expansible film of a soft polyvinyl chloride (elastic modulus: $1.80 \times 10^8$ N/m$^2$, thickness: 100 μm and antiexpansibility: $18.0 \times 10^3$ N/m) and an adhesive layer based on a peelable type adhesive (acrylic polymer crosslinking type, elastic modulus: $3.0 \times 10^5$ N/m², thickness: 10 μm and antiexpansibility: 3.0 N/m). Prior to use, a release film (polyethylene terephthalate film, thickness: 38 μm) was stuck to the adhesive layer in order to protect the adhesive layer.

A soft polyvinyl chloride film (elastic modulus: $1.80 \times 10^8$ N/M², thickness: 70μm and antiexpansibility: $12.6 \times 10^3$ N/m) was used as an antiexpansibility increasing film, and a peelable type adhesive (acrylic polymer crosslinking type, elastic modulus: $3.0 \times 10^5$ N/m², thickness: 10 μm and antiexpansibility: 3.0 N/m) was used as a ring frame fixing adhesive. The employed antiexpansibility increasing film had an inside diameter of 165 mm and an outside diameter of 207 mm, which was the same as the diameter of the expansible film.

The chip spacings of the thus obtained adhesive sheet for wafer setting were measured. The results are given in Table 1.

EXAMPLE 5

The same procedure as in Example 2 was repeated except that a film of an ethylene/methyl methacrylate copolymer (elastic modulus: $1.35 \times 10^8$ N/m², thickness: 80 μm and antiexpansibility: $10.8 \times 10^3$ N/m) was used as an antiexpansibility increasing film and a peelable type adhesive (acrylic polymer crosslinking type, elastic modulus: $3.0 \times 10^5$ N/m², thickness: 10 μm and antiexpansibility: 3.0 N/m) was used as a ring frame fixing adhesive. The results are given in Table 1.

EXAMPLE 6

The same procedure as in Example 4 was repeated except that a film of an ethylene/methyl methacrylate copolymer (elastic modulus: $1.35 \times 10^8$ N/m², thickness: 80 μm and antiexpansibility: $10.8 \times 10^3$ N/m) was used as an sibility increasing film and a peelable type adhesive (acrylic polymer crosslinking type, elastic modulus: $3.0 \times 10^5$ N/m², thickness: 10 μm and antiexpansibility: 3.0 N/m) was used as a ring frame fixing adhesive. The results are given in Table 1.

Comparative Example 1

The same procedure as in Example 1 was repeated except that no antiexpansibility increasing film was used. The results are given in Table 1.

Comparative Example 2

The same procedure as in Example 2 was repeated except that no antiexpansibility increasing film was used. The results are given in Table 1.

Comparative Example 3

The same procedure as in Example 3 was repeated except that no antiexpansibility increasing film was used. The results are given in Table 1.

Comparative Example 4

The same procedure as in Example 4 was repeated except that no antiexpansibility increasing film was used. The results are given in Table 1.

TABLE 1

| | Antiexpansibility (N/m) | | Chip spacing (μm) | |
|---|---|---|---|---|
| | Wafer setting part | Marginal part of sheet | X-axis | Y-axis |
| Ex. 1 | $8.1 \times 10^3$ | $20.7 \times 10^3$ | 260 | 200 |
| Ex. 2 | $8.7 \times 10^3$ | $21.3 \times 10^3$ | 240 | 230 |
| Ex. 3 | $5.7 \times 10^3$ | $18.3 \times 10^3$ | 490 | 330 |
| Ex. 4 | $18.0 \times 10^3$ | $30.6 \times 10^3$ | 290 | 280 |
| Ex. 5 | $8.7 \times 10^3$ | $19.5 \times 10^3$ | 350 | 250 |
| Ex. 6 | $18.0 \times 10^3$ | $28.8 \times 10^3$ | 330 | 270 |
| Com. Ex. 1 | $8.1 \times 10^3$ | $8.1 \times 10^3$ | 40 | 50 |
| Com. Ex. 2 | $8.7 \times 10^3$ | $8.7 \times 10^3$ | 70 | 60 |
| Com. Ex. 3 | $5.7 \times 10^3$ | $5.7 \times 10^3$ | 60 | 60 |
| Com. Ex. 4 | $18.0 \times 10^3$ | $18.0 \times 10^3$ | 140 | 130 |

What is claimed is:

1. An adhesive sheet for wafer setting, comprising:
   an adhesive sheet comprising an expansible film and an adhesive layer for wafer setting,
   said adhesive sheet having a marginal part configured to be outside of a wafer setting part and at least inside of a ring frame when the ring frame is fixed on the adhesive sheet and to which an antiexpansibility increasing film is laminated,
   wherein the adhesive layer is formed only on and around the wafer setting part of a surface of the expansible film and the antiexpansibility increasing film is laminated either directly or through the medium of another adhesive layer onto a marginal part of the surface of the expansible film.

2. The adhesive sheet as claimed in claim 1, wherein the antiexpansibility film extends beyond an edge of the adhesive sheet.

3. An adhesive sheet for wafer setting, comprising:
   an adhesive sheet comprising an expansible film and an adhesive layer for wafer setting,
   said adhesive sheet having a marginal part configured to be outside of a wafer setting part and at least inside of a ring frame when the ring frame is fixed on the adhesive sheet and to which an antiexpansibility increasing film is laminated,
   wherein the adhesive layer is formed on the whole surface of the expansible film and the antiexpansibility increasing film is laminated either directly or through the medium of another adhesive layer onto another surface of the expansible film.

4. The adhesive sheet as claimed in claim 3, wherein the antiexpansibility film extends beyond an edge of the adhesive sheet.

* * * * *

UNITED STATES PATENT AND TRADEMARK OFFICE
CERTIFICATE OF CORRECTION

PATENT NO. : 6,042,922
DATED : March 28, 2000
INVENTOR(S) : Kideo Senoo et al.

It is certified that error appears in the above-identified patent and that said Letters Patent is hereby corrected as shown below:

Column 6 Line 28 "N/M$^2$" should read --N/m$^2$--.

Column 6 Line 46 "N/M)" should read --N/m)--.

Column 7 Line 8 "N/M$^2$" should read --N/m$^2$--.

Column 7 Line 37 "sibility" should read --antiexpansibility--.

Signed and Sealed this

Tenth Day of April, 2001

Attest:

NICHOLAS P. GODICI

*Attesting Officer*   Acting Director of the United States Patent and Trademark Office